US009109762B2

(12) United States Patent
Yamakawa et al.

(10) Patent No.: US 9,109,762 B2
(45) Date of Patent: Aug. 18, 2015

(54) WHITE LIGHT SOURCE AND WHITE LIGHT SOURCE SYSTEM INCLUDING THE SAME

(75) Inventors: Masahiko Yamakawa, Yokohama (JP); Yasuhiro Shirakawa, Yokohama (JP)

(73) Assignees: KABUSHIKI KAISHA TOSHIBA, Tokyo (JP); TOSHIBA MATERIALS CO., LTD., Yokohama-Shi, Kanagawa-Ken (JP)

( * ) Notice: Subject to any disclaimer, the term of this patent is extended or adjusted under 35 U.S.C. 154(b) by 44 days.

(21) Appl. No.: 14/110,830

(22) PCT Filed: Jun. 23, 2011

(86) PCT No.: PCT/JP2011/064405
§ 371 (c)(1),
(2), (4) Date: Oct. 9, 2013

(87) PCT Pub. No.: WO2012/144087
PCT Pub. Date: Oct. 26, 2012

(65) Prior Publication Data
US 2014/0036499 A1  Feb. 6, 2014

(30) Foreign Application Priority Data
Apr. 22, 2011  (JP) ................................. 2011-095906

(51) Int. Cl.
*H01J 1/62*  (2006.01)
*H01J 63/04*  (2006.01)
(Continued)

(52) U.S. Cl.
CPC ... *F21K 9/56* (2013.01); *F21K 9/13* (2013.01); *H05B 33/0803* (2013.01);
(Continued)

(58) Field of Classification Search
CPC .................................................. H05B 33/0857
See application file for complete search history.

(56) References Cited

U.S. PATENT DOCUMENTS 7,963,665 B2  6/2011  Minoda et al.
8,410,507 B2  4/2013  Stauss et al.
(Continued)

FOREIGN PATENT DOCUMENTS

DE  102008050643 A1  4/2010
EP  2164301  3/2010
(Continued)

OTHER PUBLICATIONS

International Search Report (in Japanese with English translation) for PCT/JP2011/064405, mailed Sep. 6, 2011 (ISA/JP).
(Continued)

*Primary Examiner* — Karabi Guharay
*Assistant Examiner* — Zachary J Snyder
(74) *Attorney, Agent, or Firm* — Harness, Dickey & Pierce, PLC

(57) ABSTRACT

The present invention provides a white light source comprising a blue light emitting LED having a light emission peak of 421 to 490 nm and satisfying a relational equation of $-0.2 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.2,$ assuming that: a light emission spectrum of the white light source is $P(\lambda)$; a light emission spectrum of black-body radiation having a same color temperature as that of the white light source is $B(\lambda)$; a spectrum of a spectral luminous efficiency is $V(\lambda)$; a wavelength at which $P(\lambda) \times V(\lambda)$ becomes largest is $\lambda max1$; and a wavelength at which $B(\lambda) \times V(\lambda)$ becomes largest is $\lambda max2$. According to the above white light source, there can be provided a white light source capable of reproducing the same light emission spectrum as that of natural light.

10 Claims, 11 Drawing Sheets

(51) Int. Cl.
  *F21V 1/00* (2006.01)
  *F21K 99/00* (2010.01)
  *H05B 33/08* (2006.01)
  *H01L 25/075* (2006.01)
  *F21Y 101/02* (2006.01)
  *F21Y 113/00* (2006.01)

(52) U.S. Cl.
  CPC ........ *H05B 33/0857* (2013.01); *F21Y 2101/02* (2013.01); *F21Y 2113/005* (2013.01); *F21Y 2113/007* (2013.01); *H01L 25/0753* (2013.01)

(56) References Cited

U.S. PATENT DOCUMENTS

| | | | |
|---|---|---|---|
| 2006/0226759 A1* | 10/2006 | Masuda et al. | 313/486 |
| 2007/0268234 A1* | 11/2007 | Wakabayashi et al. | 345/102 |
| 2008/0259589 A1 | 10/2008 | Van De Ven | |
| 2009/0014741 A1 | 1/2009 | Masuda et al. | |
| 2009/0225564 A1 | 9/2009 | Minoda et al. | |
| 2009/0303694 A1 | 12/2009 | Roth et al. | |
| 2010/0063566 A1 | 3/2010 | Uchiumi et al. | |
| 2010/0070064 A1 | 3/2010 | Tseng et al. | |
| 2010/0258828 A1 | 10/2010 | Ramer et al. | |
| 2012/0037933 A1 | 2/2012 | Roth et al. | |

FOREIGN PATENT DOCUMENTS

| | | |
|---|---|---|
| JP | H10-242513 A | 9/1998 |
| JP | 2007299714 A | 11/2007 |
| JP | 2009-019163 A | 1/2009 |
| JP | 2009218062 A1 | 9/2009 |
| JP | 2009-289957 A | 12/2009 |
| JP | 2010-067961 A | 3/2010 |
| KR | 1020070098194 A | 10/2007 |
| WO | WO2006/023100 A1 | 3/2006 |
| WO | WO-2008/069101 A1 | 6/2008 |
| WO | WO2009/029575 A1 | 3/2009 |

OTHER PUBLICATIONS

Extended European Search Report dated Sep. 19, 2014 in related EP Application No. EP11863791.

English translation of the International Preliminary Report on Patentability and Written Opinion of the International Searching Authority in corresponding PCT/JP2011/064405.

* cited by examiner

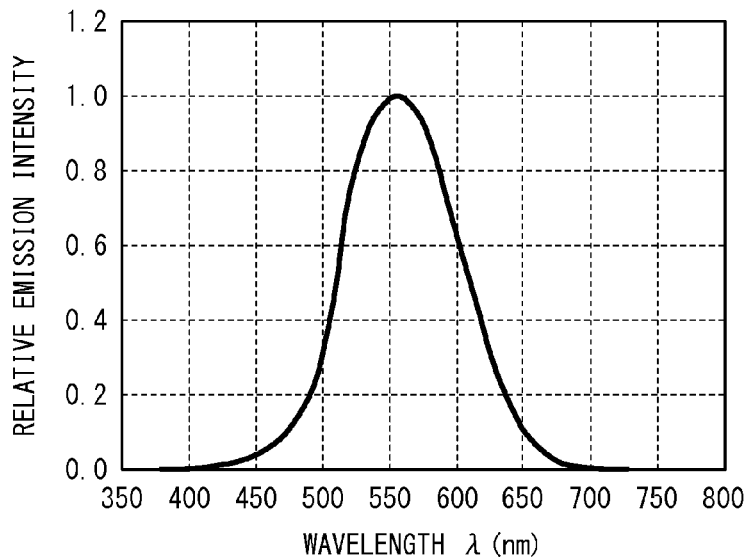
FIG. 1
$$B(\lambda) = \frac{2hc^2}{\lambda^5} \frac{1}{e^{hc/\lambda kT}-1}$$
FIG. 2
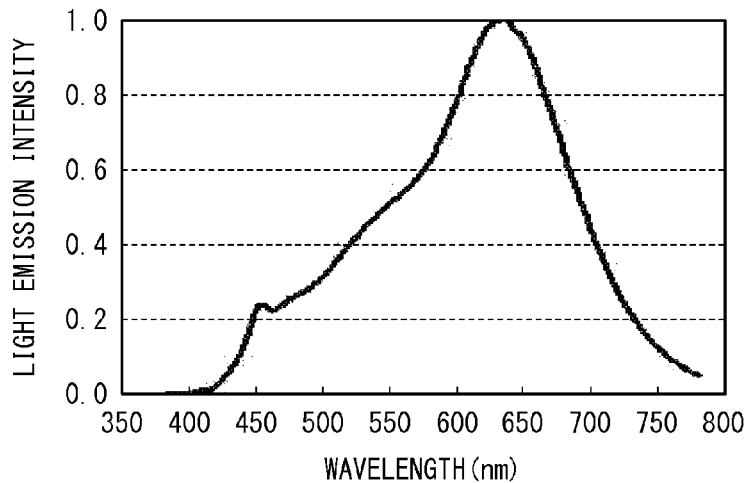
FIG. 3

WHITE LIGHT SOURCE AND WHITE LIGHT SOURCE SYSTEM INCLUDING THE SAME

CROSS-REFERENCE TO RELATED APPLICATIONS

This application is a 371 U.S. National Stage of International Application No. PCT/JP2011/064405, filed on Jun. 23, 2011, which claims priority to Japanese Patent Application No. 2011-095906, filed on Apr. 22, 2011. The contents of the above applications are incorporated herein by reference in their entirety.

TECHNICAL FIELD

The present invention relates to a white light source and a white light source system including the white light source. More particularly, the present invention relates to a white light source having a light emission spectrum close to the light emission spectrum of natural light, and relates to a white light source system including the white light source.

BACKGROUND ART

In recent years, white light sources including light emitting diodes (LEDs) have attracted attention in terms of energy saving measures and a reduction in the amount of emitted carbon dioxide. As compared with conventional incandescent bulbs including tungsten filaments, LEDs have longer service life, and enable energy saving. As disclosed in Japanese Patent Laid-Open (Unexamined Publication) No. HEI 10 (1990)-242513 (Patent Document 1), in conventional white LEDs, YAG phosphors are excited using blue LEDs each having a light emission peak wavelength in a range of 400 to 530 nm, and the blue light emitted from the LEDs and the yellow light emitted from the YAG phosphors are mixed with each other, whereby white light is achieved and realized.

White light sources including LEDs have been widely used as backlights of traffic signal lights and liquid crystal displays (LCD) as well as general lighting equipment (illuminating equipment) such as room lights. In the light emission spectra of conventional white light sources including blue LEDs, the peak height of the blue light emitted from the blue LEDs is as large as at least 1.5 times the peak height of the yellow light emitted from phosphors, and hence influences of the blue light tend to be strong.

Under the circumstances, with the popularization of the white light sources including LEDs, adverse effects of the white light sources on human bodies start to be worried about. As described above, the light emission peaks of blue LEDs are strong in conventional white LEDs. Such white light having a strong blue emission peak is significantly different from that of natural light. Here, the natural light refers to sunlight.

According to the pamphlet of International Publication No. WO 2008/069101 (Patent Document 2), which has been achieved in consideration of the influences of such white light sources on human bodies, LEDs and phosphors having different light emission peaks are combined, and four types of light emission peak are thus mixed, whereby a white light with a small deviation from the spectral luminous efficiency is provided.

Here, the sensitivity of a human eye to light is referred to as luminosity function, and the spectral luminous efficiency is defined as standard spectral luminosity function $V(\lambda)$ by International Commission on Illumination (CIE). Accordingly, the spectral luminous efficiency and the standard spectral luminosity function $V(\lambda)$ are the same in meaning. FIG. 1 shows the spectral luminous efficiency $V(\lambda)$ defined by CIE. That is, FIG. 1 shows that humans recognize light having a wavelength of about 555 nm at the highest sensitivity.

On the other hand, Patent Document 2 has an object to control light having a wavelength in a range of 420 to 490 nm, in consideration of influences of blue light on human bodies. Such a method can be expected to produce an effect of normalizing the secretion of melatonin that is one of hormones concerning adjustment by a biological clock in the nighttime.

In this regard, humans have a circadian rhythm (24-hour rhythm) controlled by an internal body clock. Humans are supposed to basically live under natural light, but there are a variety of lifestyles, such as long-time indoor work and a day-night reversal style, in modern society. If a life without exposure to natural light is continued for a long period, the circadian rhythm is disturbed, and adverse effects on human bodies are worried about.

PRIOR ART DOCUMENTS

Patent Document

Patent Document 1: Japanese Patent Laid-Open No. 10 (1998)-242513

Patent Document 2: the pamphlet of International Publication No. WO 2008/069101

DISCLOSURE OF THE INVENTION

Problems to be Solved by the Invention

Current white light sources including LEDs, that is, white light sources including blue LEDs have light emission spectra significantly different from that of natural light. A long-time life under irradiation by such white light sources may adversely affect a human circadian rhythm.

The present invention, which has been achieved in order to deal with such a problem, has an object to provide a white light source and a white light source system including the white light source having a light emission spectrum close to the light emission spectrum of natural light.

Means for Solving the Problems

In order to achieve the above-mentioned object, a white light source according to the present invention comprises a blue light emitting LED having a light emission peak of 421 to 490 nm and satisfies a relational equation of $-0.2 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.2$, assuming that: a light emission spectrum of the white light source is $P(\lambda)$; a light emission spectrum of black-body radiation having a same color temperature as that of the white light source is $B(\lambda)$; a spectrum of a spectral luminous efficiency is $V(\lambda)$; a wavelength at which $P(\lambda) \times V(\lambda)$ becomes largest is $\lambda max1$; and a wavelength at which $B(\lambda) \times V(\lambda)$ becomes largest is $\lambda max2$.

It is more preferable that the above-mentioned white light source satisfies a relational equation of $-0.1 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.1$. Further, it is preferable that the color temperature of the white light source is set to be 2,500 to 5,400 K.

It is preferable that the above-mentioned white light source includes an LED and a phosphor. Further, it is preferable that the phosphor has a light emission peak wavelength in a range of 420 to 700 nm. Further, it is preferable that the above-mentioned white light source includes three or more types (more preferably four or more types) of phosphor each having different peak wavelengths. Further, it is still more preferable that the above-mentioned white light source include five or more types of phosphor each having different peak wavelengths.

Further, it is also preferable that adjacent peak wavelengths of the phosphors are different by 150 nm or less.

Further, it is preferable that the phosphors be mixed with a resin to form a phosphor layer. Further, it is preferable that the phosphor layer have a multi-layered structure in which a plurality of phosphor elements formed by dispersing phosphor particles in a resin are laminated. Further, a white light source system according to the present invention includes a plurality of the above-mentioned white light sources according to the present invention.

Furthermore, another white light source according to the present invention is characterized in that a plurality of the white light sources each having different light emission spectrum, and a plurality of blue light emitting LEDs are arranged within one housing, and each of the white light sources satisfies the relational equation of $$-0.2 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.2.$$

In addition, a white light source system according to the present invention is configured by comprising a plurality of the afore-mentioned white light sources.

Effects of the Invention

A white light source according to the present invention can reproduce the same light emission spectrum as that of natural light. Accordingly, even if a human body is exposed to white light emitted from the white light source for a long time, adverse effects on the human body can be made equivalent to those of natural light.

BRIEF DESCRIPTION OF THE DRAWINGS

FIG. 1 is a graph showing a spectral luminous efficiency $V(\lambda)$.

FIG. 2 is a mathematical expression (formula) for obtaining a light emission spectrum $B(\lambda)$ of black-body radiation.

FIG. 3 is a graph showing a light emission spectrum $P(\lambda)$ of a white light source according to Example 1.

BEST MODE FOR CARRYING OUT THE INVENTION

A white light source according to one embodiment of the present invention comprises a blue light emitting LED having a light emission peak of 421 to 490 nm and satisfies a relational equation of $-0.2 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.2$, assuming that: the light emission spectrum of the white light source is $P(\lambda)$; the light emission spectrum of black-body radiation having the same color temperature as that of the white light source is $B(\lambda)$; the spectrum of a spectral luminous efficiency is $V(\lambda)$; the wavelength at which $P(\lambda) \times V(\lambda)$ becomes largest is $\lambda max1$; and the wavelength at which $B(\lambda) \times V(\lambda)$ becomes largest is $\lambda max2$. Here, $\lambda$ denotes a wavelength of 380 to 780 nm in a visible light region.

The white light source satisfying the above-mentioned relational equation is configured according to the following procedures. First, the light emission spectrum $P(\lambda)$ of the white light source is measured. The light emission spectrum is measured according to total luminous flux measurement using an integrating sphere in conformity with JIS-C-8152. The color temperature is calculated from the light emission spectrum. Note that the unit of the color temperature is kelvin (K).

Next, the light emission spectrum $B(\lambda)$ of the black-body radiation having the same color temperature as that of the white light source is obtained. The light emission spectrum $B(\lambda)$ is obtained according to Planck's distribution. The Planck's distribution can be obtained according to a mathematical expression shown in FIG. 2. In FIG. 2, h denotes a Planck's constant, c denotes the speed of light, $\lambda$ denotes a wavelength, e denotes a base of natural logarithm, k denotes a Boltzmann's constant, and T denotes a color temperature. Because h, c, e, and k are constants, if the color temperature T is determined, the light emission spectrum of the black-body radiation can be obtained in accordance with the wavelength $\lambda$.

In the present invention, the black-body radiation indicates the light emission spectrum of natural light (sunlight). The natural light has different color temperatures, for example, in the daytime, in the morning, and at sunrise.

Concretely, the color temperature of the natural light in the daytime is about 5,100 K, the color temperature of the natural light in the morning is about 4,200 K, and the color temperature of the natural light at sunrise is about 2,700 K. Note that the morning is assumed to be a time at 7 a.m.

Figure 5:
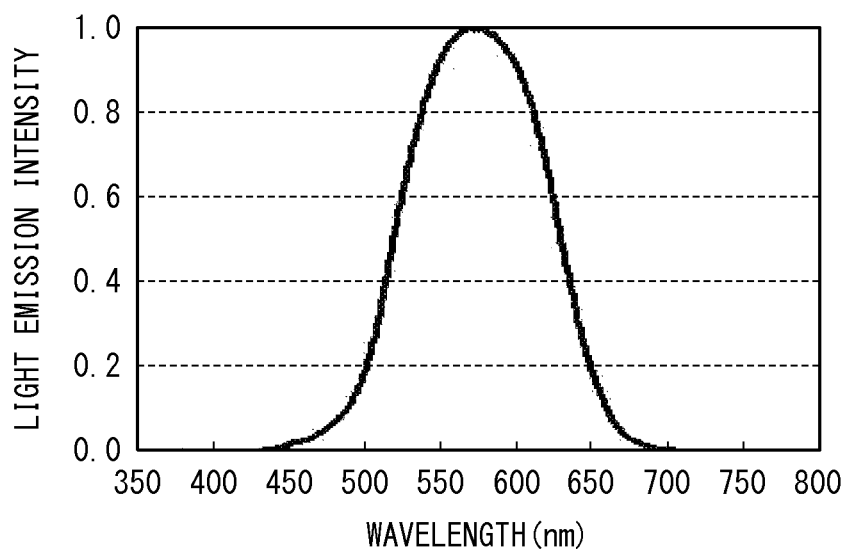
FIG. 5 is a graph showing $(P(\lambda) \times V(\lambda))/(P(\lambda max1) \times V(\lambda max1))$ in Example 1.

FIG. 3 shows a light emission spectrum $P(\lambda)$ in Example 1 to be described later. On the other hand, FIG. 5 shows $(P(\lambda) \times$ $V(\lambda))/(P(\lambda max1) \times V(\lambda max1))$ in Example 1. Further, FIG. 6 shows $(B(\lambda) \times V(\lambda))/(B(\lambda max2) \times V(\lambda max2))$ of Example 1 (color temperature: 2,700 K).

Figure 6:
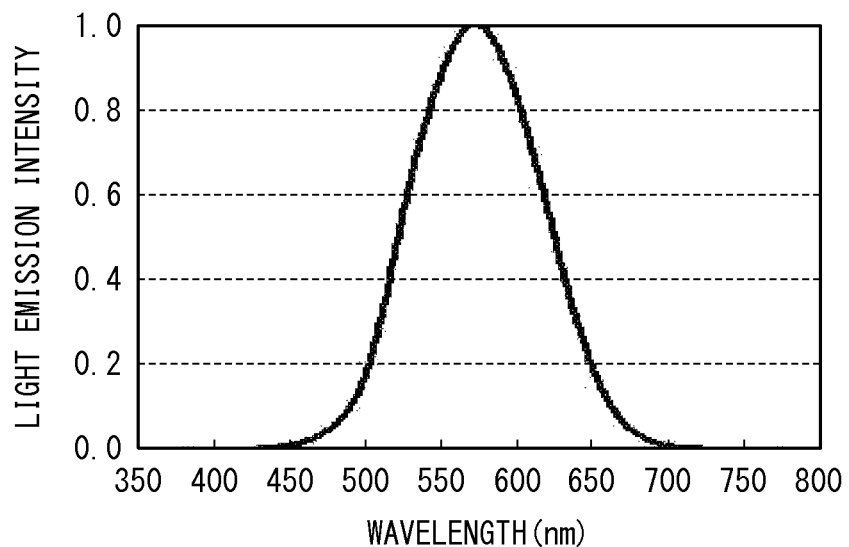
FIG. 6 is a graph showing $(B(\lambda) \times V(\lambda))/(B(\lambda max2) \times V(\lambda max2))$ in Example 1 (color temperature: 2,700 K).

The spectral luminous efficiency shown in FIG. 1 is used for $V(\lambda)$ for obtaining FIG. 5 and FIG. 6.

FIG. 5 is a graph obtained by: multiplying, for each wavelength, values of the light emission spectrum $P(\lambda)$ in Example 1 shown in FIG. 3 by values of the spectral luminous efficiency $V(\lambda)$; dividing the resultant products by $(P(\lambda max1) \times V(\lambda max1))$; and plotting the resultant quotients. In FIG. 5, the wavelength at which $(P(\lambda) \times V(\lambda))$ becomes largest is $\lambda max1 = 556$ nm.

Figure 4:
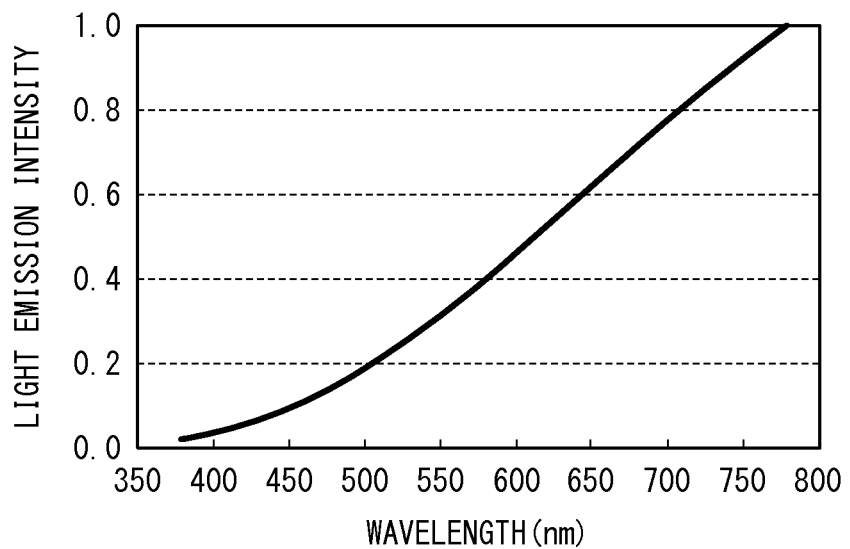
FIG. 4 is a graph showing a light emission spectrum $B(\lambda)$ of a black-body radiation in Example 1 (color temperature: 2,700 K.

FIG. 6 is a graph obtained by: multiplying, for each wavelength, values of the light emission spectrum $B(\lambda)$ in FIG. 4 by values of the spectral luminous efficiency $V(\lambda)$; dividing the resultant products by $(B(\lambda max2) \times V(\lambda max2))$; and plotting the resultant quotients. In FIG. 6, the wavelength at which $(B(\lambda) \times V(\lambda))$ becomes largest is $\lambda max2 = 556$ nm.

$(P(\lambda) \times V(\lambda))$ indicates the intensity of the light emission spectrum of the white light source in a spectral luminous efficiency $V(\lambda)$ region. $(P(\lambda) \times V(\lambda))$ is divided by $(P(\lambda max1) \times V(\lambda max1))$ that is the maximum value, whereby the upper limit thereof can be 1.0 as shown in FIG. 5.

Further, $(B(\lambda) \times V(\lambda))$ indicates the intensity of the light emission spectrum of the black-body radiation in the spectral luminous efficiency $V(\lambda)$ region. $(B(\lambda) \times V(\lambda))$ is divided by $(B(\lambda max2) \times V(\lambda max2))$ that is the maximum value, whereby the upper limit thereof can be 1.0 as shown in FIG. 6.

Next, a difference $A(\lambda) = [(P(\lambda) \times V(\lambda))/(P(\lambda max1) \times V(\lambda max1)) - (B(\lambda) \times V(\lambda))/(B(\lambda max2) \times V(\lambda max2))]$ is obtained. The white light source according to the present embodiment satisfies a relation: $-0.2 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.2$. If the difference $A(\lambda)$ satisfies the relation: $-0.2 \leq A(\lambda) \leq +0.2$, the light emission spectrum of the white light source in the spectral luminous efficiency $V(\lambda)$ region is close to the light emission spectrum of the black-body radiation, in other words, the light emission spectrum of the natural light. That is, if the difference $A(\lambda)$ is zero ($A(\lambda) = 0$), the same light emission spectrum as that of the natural light can be reproduced.

Figure 7:
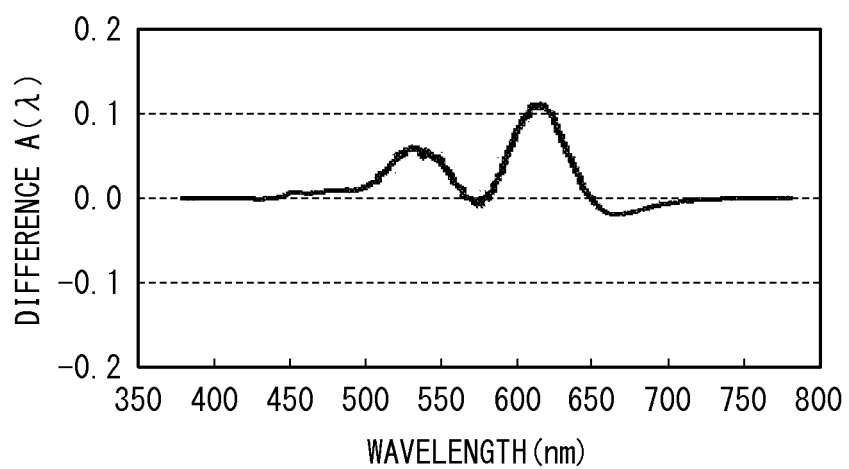
FIG. 7 is a graph showing a difference $A(\lambda)$ in Example 1.

FIG. 7 shows the difference $A(\lambda)$ in Example 1. As is apparent from FIG. 7, in Example 1, the range of the difference $A(\lambda)$ is $-0.03 \leq A(\lambda) \leq +0.11$, and it can be confirmed that the natural light in the daytime is reproduced in Example 1.

As described above, according to the present embodiment, the light emission spectrum is designed to be close to the light emission spectrum of the black-body radiation. Hence, as compared with conventional white LEDs having blue light peaks that stand out to be outstanding, the present embodiment can considerably suppress the adverse effects on a human circadian rhythm.

As described later in examples, the natural light at sunrise and the natural light in the morning can be also reproduced, and hence the light emission spectrum may be controlled so as to suit an intended use.

Further, if white light sources that can reproduce the natural light in the daytime, the natural light at sunrise, and the natural light in the morning are combined, the same natural light as one-day sunlight can be reproduced. For example, if such combined white light sources are used as lighting equipment in a hospital ward and in a place or room used for long-time indoor work, adverse effects on the circadian rhythms of patients who live therein and staffs who work therein can be suppressed. Further, because the natural light can be reproduced, application to agricultural fields such as plant cultivation using the natural light is also possible.

It is preferable that such a white light source have a light emission color temperature of 2,500 to 5,400 K. If this color temperature falls below 2,500 K and exceeds 5,400 K, there may be a feat that a light emitted from the white light source greatly differ from the natural light and it becomes difficult to control the color temperature. The preferable range of the color temperature is 2,700 to 5,200 K.

It is preferable that the white light source having the difference $A(\lambda)$ as described above comprises: a light emitting diode (LED); and a phosphor. It is preferable for LED to use a blue light emitting LED having a light emission peak wavelength in a range of 421 to 490 nm. It is also preferable to adopt a method of converting LED light having a light emission peak in an ultraviolet to violet region, into visible light by means of the phosphor. The light emission peak heights of a blue LED, a green LED, and a red LED each having a light emission peak wavelength of 490 nm or more are large, and hence it is difficult to control the difference $A(\lambda)$ thereof to fall within a range of $-0.2 \leq A(\lambda) \leq +0.2$. Further, not limited to LEDs, a semiconductor laser and the like may be also used as long as the used light emission source has a light emission peak wavelength of 421 to 490 nm.

It is preferable that, when the phosphor is excited by a light emission source of 421 to 490 nm, the light emission peak wavelength of the phosphor be in a range of 421 to 700 nm. Further, it is also preferable to use three or more types (more preferably five or more types) of phosphors each having different peak wavelengths. Further, adjacent peak wavelengths of the phosphors are different (are deviated to each other) by preferably 150 nm or less, more preferably 10 to 100 nm, and still more preferably 10 to 50 nm. That is, from a blue region to a red region, the peak wavelengths different every 10 to 100 nm are combined with the use of three or more types (more preferably five or more types) of phosphors, whereby the relation: $-0.2 \leq$ the difference $A(\lambda) \leq +0.2$ can be achieved.

The material for constituting each phosphor is not particularly limited as long as the light emission peak thereof is within a range of 420 to 700 nm, and the following phosphors are preferable as phosphors excited at 421 to 490 nm. Further, the half-value width (half band width) of the peak wavelength of the light emission spectrum of each phosphor is as wide as preferably 40 nm or more and more preferably 50 to 100 nm.

Examples of the blue phosphor (B) may include a europium-activated alkaline-earth phosphate phosphor (a peak wavelength of 440 to 455 nm) and a europium-activated barium magnesium aluminate phosphor (a peak wavelength of 450 to 460 nm) or the like. Further, examples of the blue-green phosphor may include a europium-activated strontium aluminate phosphor (a peak wavelength of 480 to 500 nm) and a europium- and manganese-activated barium magnesium aluminate phosphor (a peak wavelength of 510 to 520 nm) or the like.

Examples of the green phosphor (G) may include a europium-activated orthosilicate phosphor (a peak wavelength of 520 to 550 nm), a europium-activated β-sialon phosphor (a peak wavelength of 535 to 545 nm), and a europium-activated strontium sialon phosphor (a peak wavelength of 510 to 530 nm) or the like.

Examples of the yellow phosphor (Y) may include a europium-activated orthosilicate phosphor (a peak wavelength of 550 to 580 nm) and a cerium-activated rare-earth aluminum garnet phosphor (a peak wavelength of 550 to 580 nm) or the like.

Examples of the red phosphor (R) may include a europium-activated strontium sialon phosphor (a peak wavelength of 600 to 630 nm), a europium-activated calcium strontium oxynitride phosphor (a peak wavelength of 610 to 650 nm), a europium-activated lanthanum oxysulfide phosphor (a peak wavelength of 620 to 630 nm), and a manganese-activated magnesium fluorogermanate (a peak wavelength of 640 to 660 nm) or the like.

In order to control the difference $A(\lambda)$, it is preferable to use three or more types (more preferably five or more types) of phosphor from among the above-mentioned examples of the blue phosphor, the blue-green phosphor, the green phosphor, the yellow phosphor, and the red phosphor. Further, the color temperature can be controlled by changing a mixing proportion (mixing ratio) of the phosphors.

It is preferable that the average particle size of each phosphor is set to be 5 to 40 μm. If the average particle size is less than 5 μm, the particle size is excessively small, and manufacture of the phosphors is thus difficult, leading to an increase in manufacturing costs. On the other hand, if the average particle size is larger than 40 μm, it becomes difficult to uniformly mix the respective phosphors.

Figure 19:
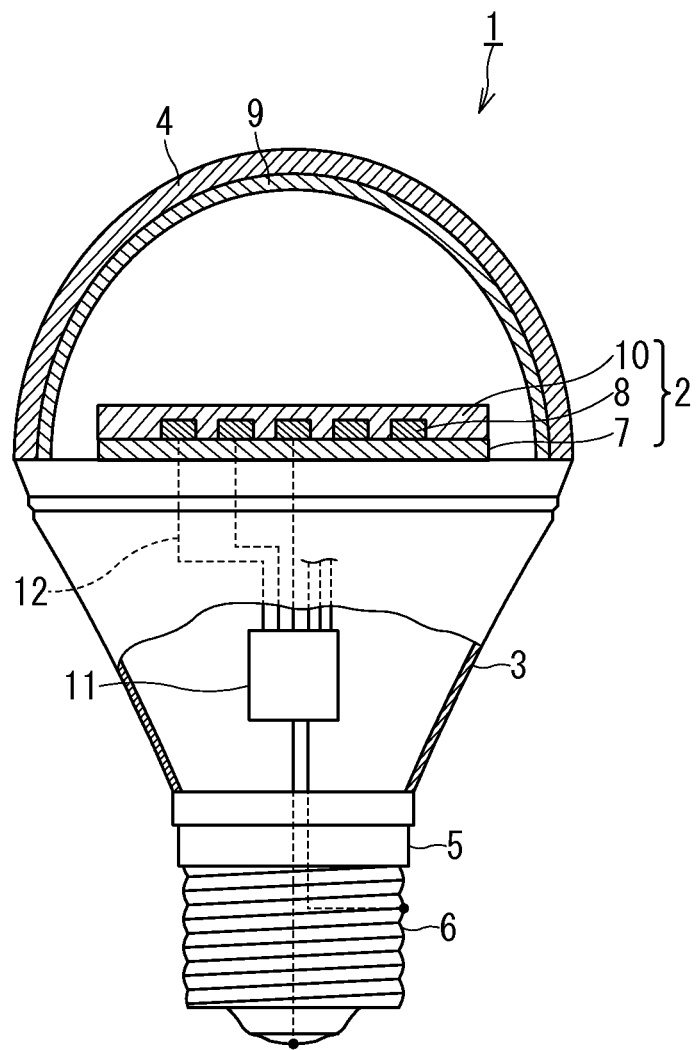
FIG. 19 is a cross sectional view illustrating one embodiment of the bulb-type white light source according to the present invention.

Next, a structure of the white light source will be explained hereunder. FIG. 19 illustrates a bulb-type white light source as an embodiment of the white light source according to the present invention. In FIG. 19, a reference numeral of 1 denotes an LED bulb (white light source), 2 denotes an LED module, 3 denotes a base body, 4 denotes a globe, 5 denotes an insulating member, 6 denotes a cap (mouth ring), 7 denotes a substrate, 8 denotes LED chips, 9 denotes a phosphor layer, and 10 denotes a transparent resin layer.

That is, the LED bulb 1 illustrated in FIG. 19 includes: the LED module 2; the base body 3 onto which the LED module 2 is arranged; the globe 4 as a housing that is attached to an upper portion of the base body 3 so as to cover the LED module 2; the cap 6 that is attached to a lower end portion of the base body 3 with the intermediation of the insulating member 5; and a lighting circuit 11 provided inside of the base body 3.

The LED module 2 includes the LED chips 8 that emit ultraviolet to violet light and are mounted on the substrate 7. The plurality of LED chips 8 are surface-mounted on the substrate 7. For example, InGaN-based, GaN-based, and AlGaN-based light emitting diodes or the like are used for the LED chips 8 that emit ultraviolet to violet light.

A wiring network (not illustrated) is provided on a surface of the substrate 7 (further provided inside thereof as needed), and an electrode of each LED chip 8 is electrically connected to the wiring network of the substrate 7. Wiring lines 12 are drawn out from a side surface or a bottom surface of the LED module 2, and the wiring lines 12 are electrically connected to the lighting circuit 11 provided inside of the base body 3. The LED chips 8 are turned on by DC voltage applied via the lighting circuit 11.

The phosphor layer 9 that absorbs ultraviolet to violet light emitted from the LED chips 8 and emits white light is provided on an inner surface of the globe 4 as the housing. The phosphor layer 9 is formed by combining three or more types (more preferably five or more types) of phosphors each having different peak wavelengths. Further, the phosphors may be mixed with a resin to form the phosphor layer 9, as needed. Further, all the phosphors may be mixed to form a mixed phosphor layer. Alternatively, phosphor layers formed by mixing about one to three types of phosphor are laminated to form a multi-layered phosphor layer.

Although FIG. 19 illustrates a structure in which the phosphor layer 9 is provided on the inner surface of the globe 4, the phosphor layer may be provided on an outer surface of the globe 4, or the phosphors may be mixed in the globe 4 itself, and the phosphor particles may be mixed in the transparent resin layer 10. Although FIG. 19 illustrates the bulb-type white light source, the present invention is not limited thereto, and can also be applied to a one-chip type white light source. Further, not limited to the above-mentioned bulb types, the white light source according to the present invention can also be applied to a fluorescent light type (elongated type), a chandelier type, and the like, and the shape of the white light source is not particularly limited.

As described above, the difference $A(\lambda)$ is controlled to satisfy the relation: $-0.2 \leq A(\lambda) \leq +0.2$, whereby a white light source that reproduces natural light can be provided. Further, white light sources that reproduce the natural light in the daytime, the natural light at sunrise, the natural light in the morning, the natural light in the evening, and the like are combined, whereby a white light source system that reproduces a rhythm of one-day natural light can be configured. As a result, it is possible to provide a white light source and a white light source system that can suppress the adverse effects on a human body circadian rhythm.

EXAMPLES

Example 1

Blue light emitting LED chips each having a light emission peak wavelength of 450 nm were prepared. Next, there was prepared a mixture including: a europium-activated strontium aluminate blue-green phosphor having a peak wavelength of 490 nm; a europium-activated orthosilicate green phosphor having a peak wavelength of 530 nm; a europium-activated orthosilicate yellow phosphor having a peak wavelength of 555 nm; and a europium-activated strontium sialon red phosphor having a peak wavelength of 630 nm, as phosphors that emitted light while being irradiated with electromagnetic waves of 450 nm.

The average particle size of the phosphors was set to 15 μm. The phosphors were mixed at a ratio by weight (ratio by mass) of: blue-green phosphor:green phosphor:yellow phosphor:red phosphor=20:25:15:40, was mixed, followed by being mixed with a transparent resin, and was applied (coated) to the globe inner surface, whereby the bulb-type white light source illustrated in FIG. 19 was manufactured. The correlated color temperature of light emission color of the obtained white light source was 2,700 K. This color temperature of 2,700 K is equivalent to the color temperature of the natural light in the sunrise.

FIG. 3 shows a result obtained by measuring the light emission spectrum of the bulb-type white light source in Example 1 according to total luminous flux measurement using an integrating sphere in conformity with JIS-C-8152. FIG. 5 shows $(P(\lambda) \times V(\lambda))/(P(\lambda max1) \times V(\lambda max1))$ in Example 1, which is obtained by using the spectral luminous distribution $V(\lambda)$ in FIG. 1. Note that λmax1 in Example 1 is 574 nm.

Then, FIG. 4 shows the light emission spectrum of blackbody radiation having a color temperature of 2,700 K, which is obtained according to Planck's distribution (the equation in FIG. 2). FIG. 6 shows $(B(\lambda) \times V(\lambda))/(B(\lambda max2) \times V(\lambda max2))$, which is obtained by assuming that the light emission spectrum in FIG. 4 is $B(\lambda)$. Note that λmax2 is 572 nm.

The difference $A(\lambda)$ in Example 1 was obtained according to $[(P(\lambda) \times V(\lambda))/(P(\lambda max1) \times V(\lambda max1)) - (B(\lambda) \times V(\lambda))/(B(\lambda max2) \times V(\lambda max2))]$. FIG. 7 shows the result thereof. As is apparent from FIG. 7, in the white light source in Example 1, the difference $A(\lambda)$ from the light emission spectrum of the natural light in the daytime was in a range of −0.2 to +0.2 in a visible light region of 380 to 780 nm. Specifically, the difference $A(\lambda)$ was −0.03 to +0.11.

Example 2

Blue light emitting LED chips each having a light emission peak wavelength of 445 nm were prepared. Next, there was prepared a mixture including: a europium-activated strontium aluminate blue-green phosphor having a peak wavelength of 490 nm; a europium-activated orthosilicate green phosphor having a peak wavelength of 530 nm; a europium-activated orthosilicate green phosphor having a peak wavelength of 555 nm; a europium-activated orthosilicate yellow phosphor having a peak wavelength of 530 nm; and a europium-activated strontium sialon red phosphor having a peak wavelength of 630 nm, as the mixture of the phosphors that emitted light while being irradiated with electromagnetic waves of 445 nm.

In this regard, the average particle size of the phosphors was set to 15 μm. The respective phosphors were mixed at a ratio by weight (ratio by mass) of blue-green phosphor:green phosphor:yellow phosphor:red phosphor=30:30:20:20, then the mixture was mixed with a transparent resin, and was applied (coated) to the globe inner surface, whereby the bulb-type white light source 1 illustrated in FIG. 19 was manufactured. The correlated color temperature of light emission color of thus obtained white light source was 4,100 K. This color temperature of 4,100 K is equivalent to the color temperature of the natural light in the morning.

Figure 8:
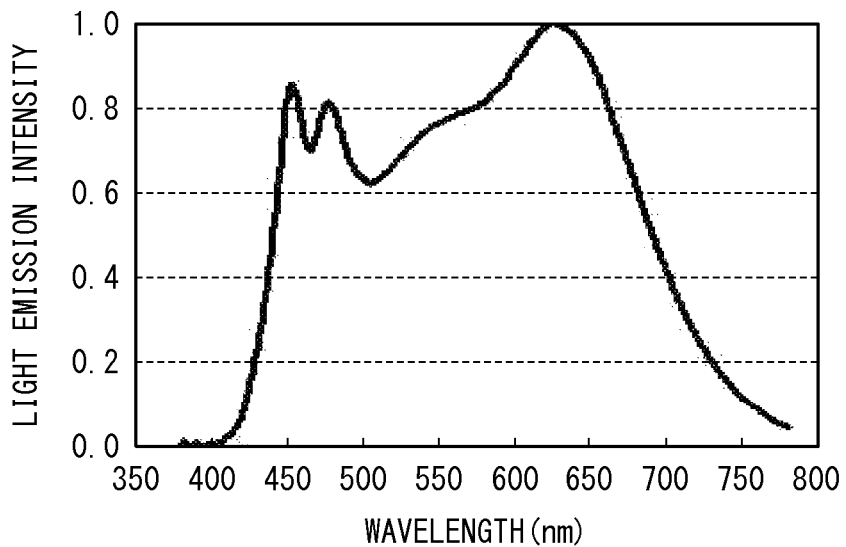
FIG. 8 is a graph showing the light emission spectrum of a white light source according to Example 2.
Figure 10:
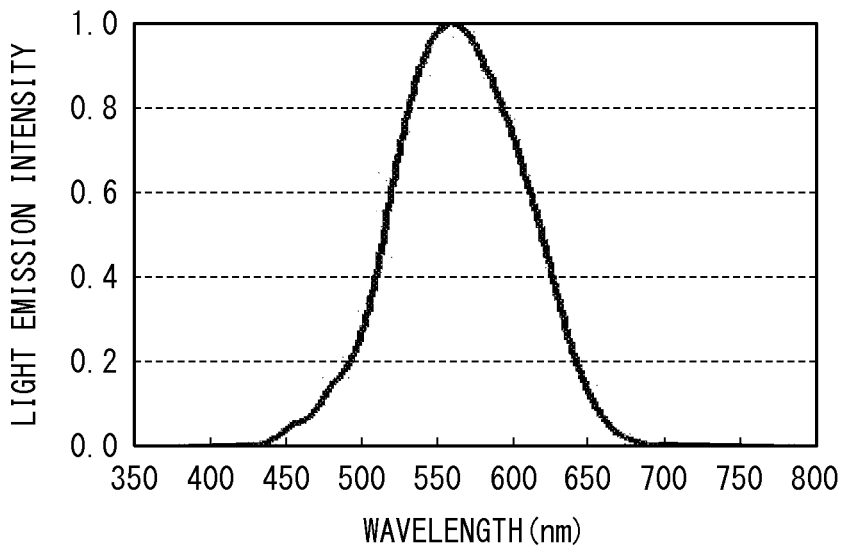
FIG. 10 is a graph showing $(P(\lambda) \times V(\lambda))/(P(\lambda max1) \times V(\lambda max1))$ in Example 2.

As the same manner as in Example 1, the light emission spectrum of the white light source in Example 2 was checked according to total luminous flux measurement by using an integrating sphere. FIG. 8 shows the result thereof. FIG. 10 shows $(P(\lambda) \times V(\lambda))/(P(\lambda max1) \times V(\lambda max1))$ in Example 2, which is obtained by using the spectral luminous efficiency $V(\lambda)$ shown in FIG. 1. Note that λmax1 in Example 2 is 559 nm.

Figure 9:
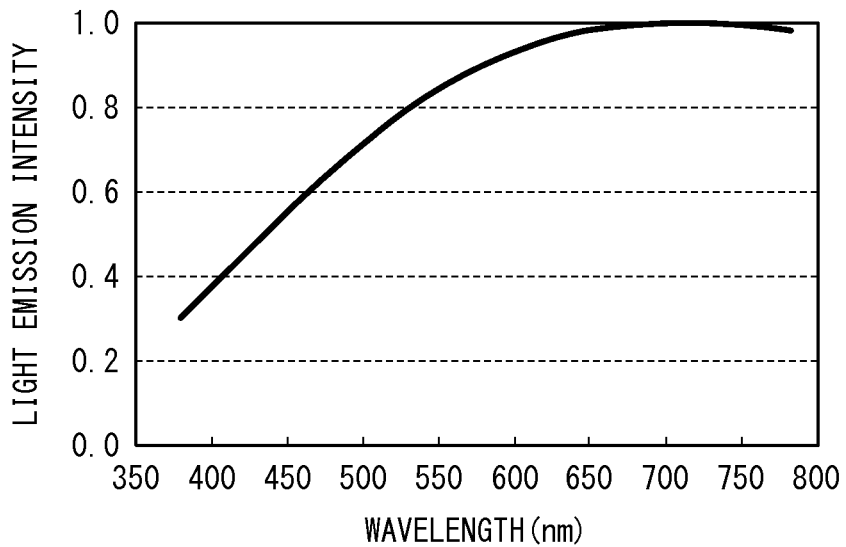
FIG. 9 is a graph showing a light emission spectrum $B(\lambda)$ of a black-body radiation in Example 2 (color temperature: 4,100 K).
Figure 11:
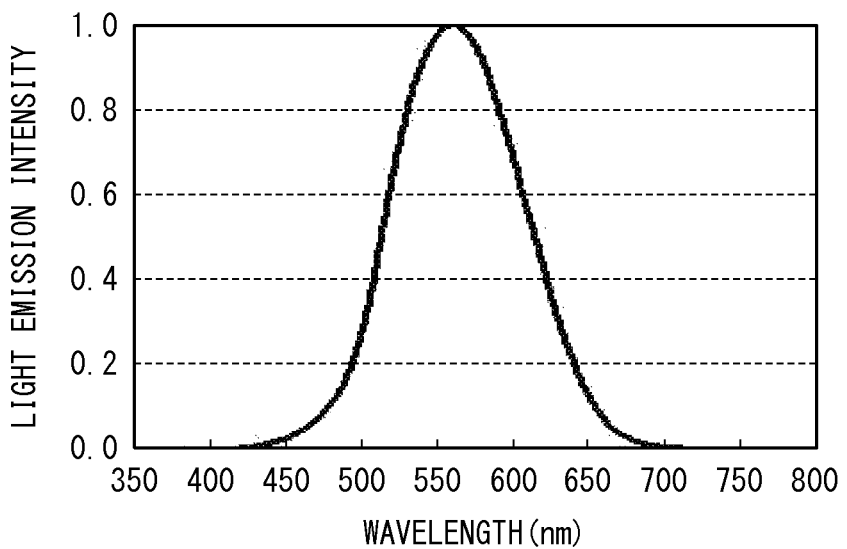
FIG. 11 is a graph showing $(B(\lambda) \times V(\lambda))/(B(\lambda max2) \times V(\lambda max2))$ in Example 2 (color temperature: 4,100 K).

Then, FIG. 9 shows the light emission spectrum of blackbody radiation having a color temperature of 4,100 K, which is obtained according to Planck's distribution (the equation in FIG. 2). FIG. 11 shows $(B(\lambda) \times V(\lambda))/(B(\lambda max2) \times V(\lambda max2))$, which is obtained by assuming that the light emission spectrum in FIG. 9 is $B(\lambda)$. Note that λmax2 is 560 nm.

Figure 12:
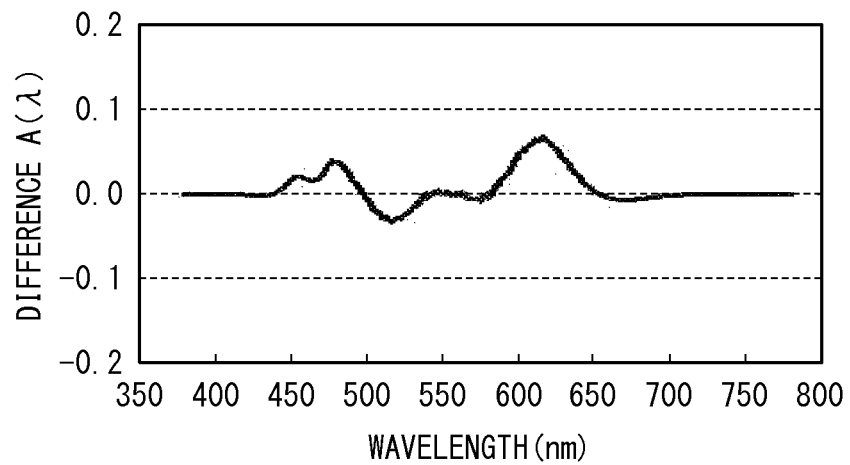
FIG. 12 is a graph showing a difference $A(\lambda)$ in Example 2.

The difference $A(\lambda)$ in Example 2 was obtained according to $[(P(\lambda) \times V(\lambda))/(P(\lambda max1) \times V(\lambda max1))-(B(\lambda) \times V(\lambda))/(B(\lambda max2) \times V(\lambda max2))]$. FIG. 12 shows the result thereof. As is apparent from FIG. 12, in the white light source in Example 2, the difference $A(\lambda)$ from the light emission spectrum of the natural light in the morning is in a range of −0.2 to +0.2 in a visible light region of 380 to 780 nm. Specifically, the difference $A(\lambda)$ is −0.04 to +0.07.

Example 3

Blue light emitting LED chips each having a light emission peak wavelength of 450 nm were prepared. There was prepared a mixture including: a europium-activated strontium aluminate blue-green phosphor having a peak wavelength of 490 nm; a europium-activated orthosilicate green phosphor having a peak wavelength of 530 nm; a europium-activated orthosilicate yellow phosphor having a peak wavelength of 555 nm; and a europium-activated strontium sialon red phosphor having a peak wavelength of 630 nm, as the mixture of phosphors that emitted light while being irradiated with electromagnetic waves of 450 nm.

In this connection, the average particle size of the respective phosphors was set to 15 μm. Then, the phosphors were mixed at a ratio by weight of blue-green phosphor:green phosphor:yellow phosphor:red phosphor=40:30:10:20. Then, the mixed phosphors were further mixed with a transparent resin, and were applied (coated) to the globe inner surface, whereby the bulb-type white light source 1 illustrated in FIG. 19 was manufactured. The correlated color temperature of light emission color of the obtained white light source was 5,400 K. This color temperature of the white light source is equivalent to the color temperature of the natural light at daytime.

Figure 13:
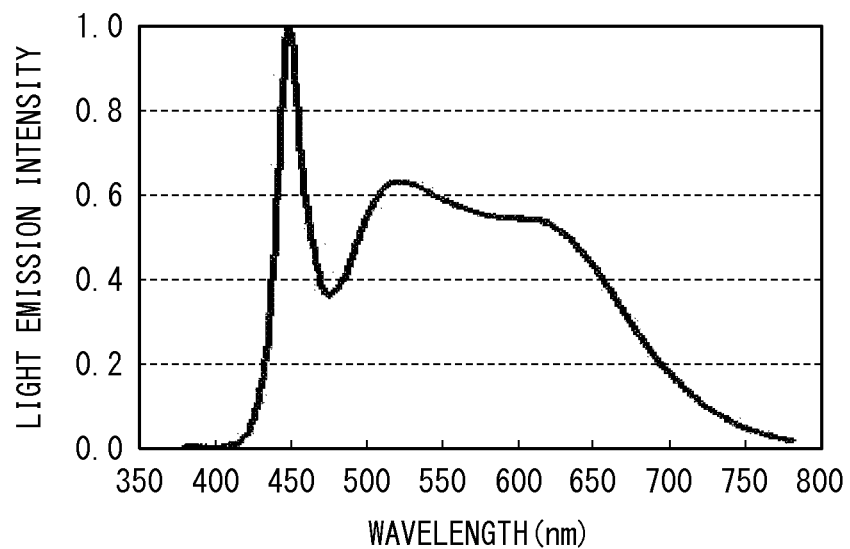
FIG. 13 is a graph showing a light emission spectrum $P(\lambda)$ of a white light source according to Example 3.
Figure 16:
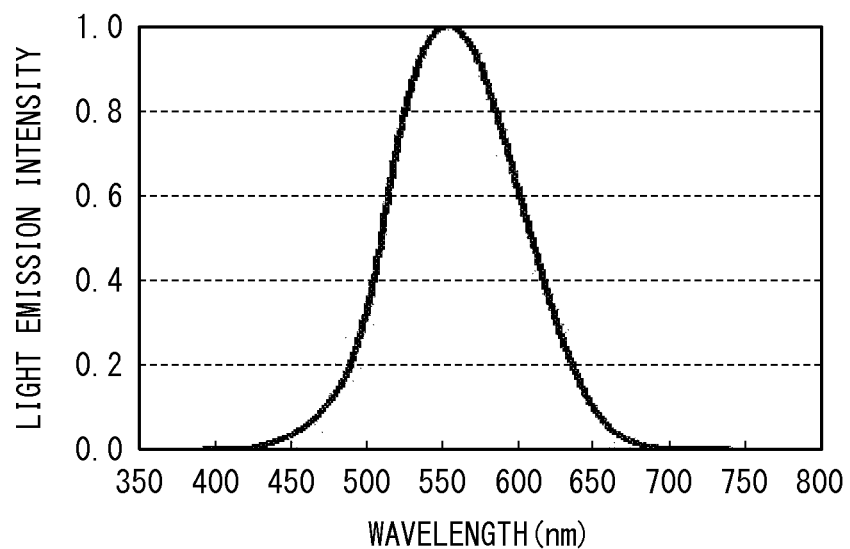
FIG. 16 is a graph showing $(B(\lambda) \times V(\lambda))/(B(\lambda max2) \times V(\lambda max2))$ in Example 3 (color temperature: 5,400 K).

As the same manner as in Example 1, the light emission spectrum $P(\lambda)$ of the white light source in Example 3 was checked according to total luminous flux measurement using an integrating sphere. FIG. 13 shows the result thereof. FIG. 16 shows $(P(\lambda) \times V(\lambda))/(P(\lambda max1) \times V(\lambda max1))$ in Example 3, which is obtained using the spectral luminous efficiency $V(\lambda)$ shown in in FIG. 1. Note that λmax1 in Example 3 is 550 nm.

Figure 14:
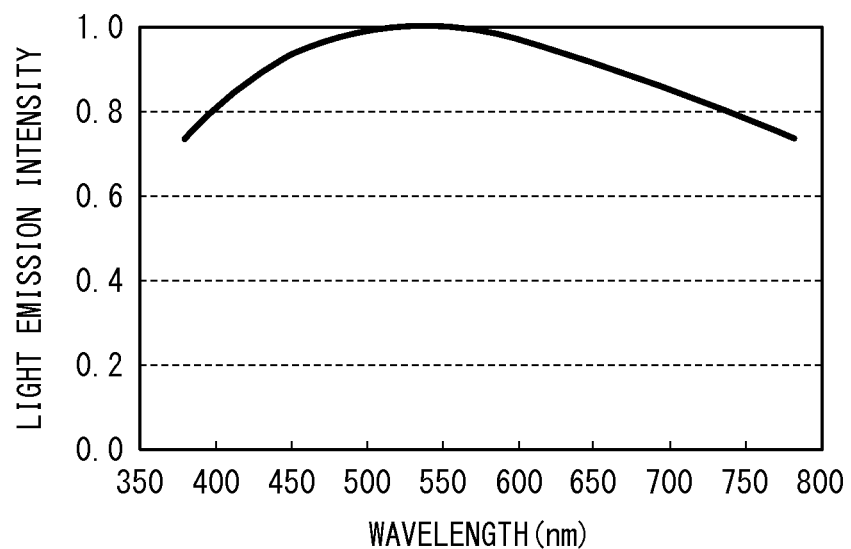
FIG. 14 is a graph showing a light emission spectrum $B(\lambda)$ of a black-body radiation in Example 3 (color temperature: 5,400 K).
Figure 15:
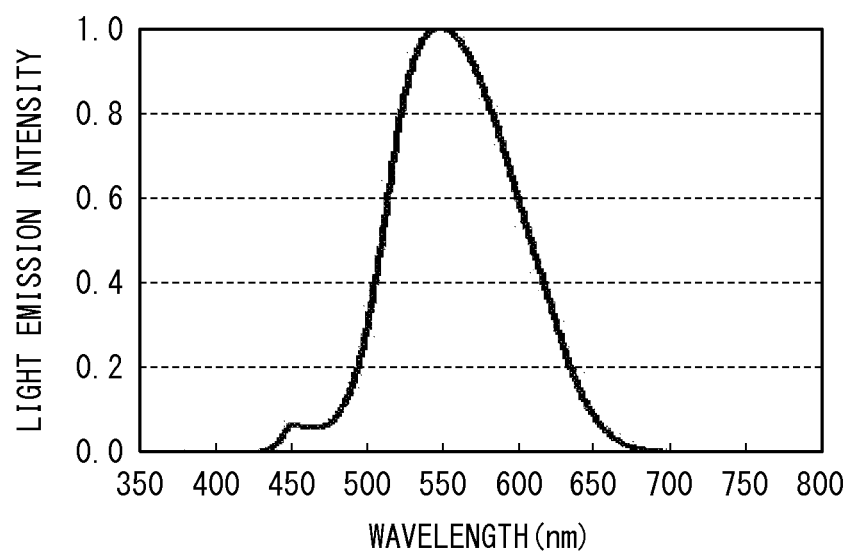
FIG. 15 is a graph showing $(P(\lambda) \times V(\lambda))/(P(\lambda max1) \times V(\lambda max1))$ in Example 3.

Then, FIG. 14 shows the light emission spectrum of blackbody radiation having a color temperature of 5,400 K, which is obtained according to Planck's distribution (the equation shown in FIG. 2). FIG. 16 shows $(B(\lambda) \times V(\lambda))/(B(\lambda max2) \times V(\lambda max2))$, which is obtained by assuming that the light emission spectrum in FIG. 14 is $B(\lambda)$. Note that λmax2 is 555 nm.

Figure 17:
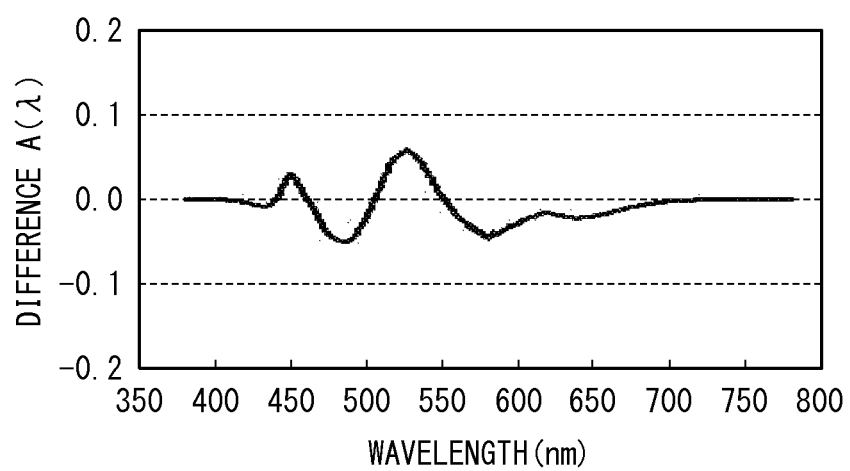
FIG. 17 is a graph showing a difference $A(\lambda)$ in Example 3.

The difference $A(\lambda)$ in Example 3 was obtained according to $[(P(\lambda) \times V(\lambda))/(P(\lambda max1) \times V(\lambda max1))-(B(\lambda) \times V(\lambda))/(B(\lambda max2) \times V(\lambda max2))]$. FIG. 17 shows the result thereof. As is apparent from FIG. 17, in the white light source in Example 3, the difference $A(\lambda)$ from the light emission spectrum of the natural light at daytime is in a range of −0.2 to +0.2 in a visible light region of 380 to 780 nm. Specifically, the difference $A(\lambda)$ is −0.06 to +0.06.

Comparative Example 1

Figure 18:
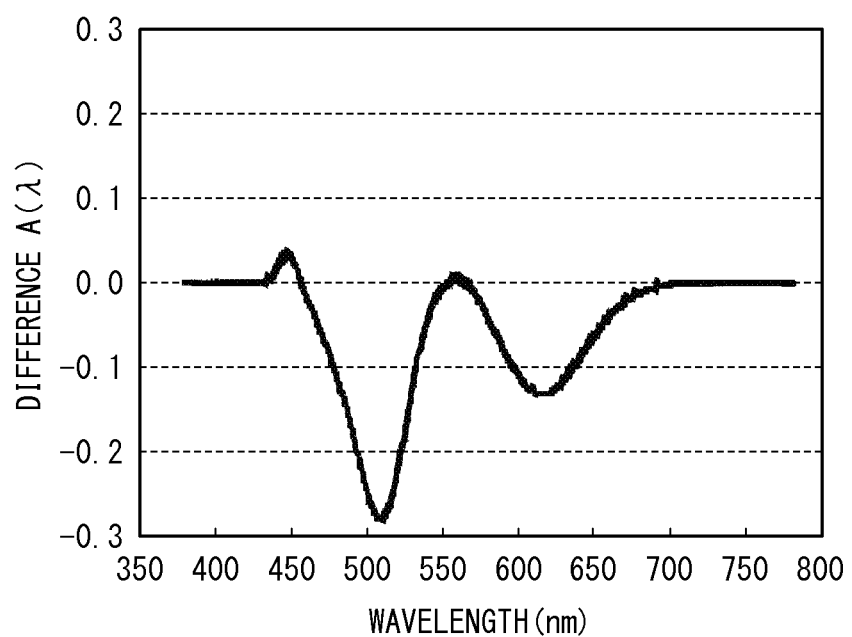
FIG. 18 is a graph showing a difference $A(\lambda)$ in Comparative Example 1.

A blue light emitting diode having a light emission peak wavelength of 460 nm was combined with a cerium-activated yttrium aluminum garnet yellow phosphor, whereby a white light source in Comparative Example 1 was manufactured. The color temperature of the white light source in Comparative Example 1 was 5,100 K, and the difference $A(\lambda)$ thereof was −0.28 to +0.04 as shown in FIG. 18.

Subjects (ten persons) spent from 9:00 to 17:00 in the daytime under the white light source in each of the above-mentioned Examples and Comparative Example 1 at the same intensity of illumination, and the amount of secreted melatonin was measured at night (21:00) of the same day. Note that the amount of secreted melatonin was analyzed according to a saliva test. The amount of secreted melatonin (the average value of the ten persons) in each of the above-mentioned examples was measured assuming that the amount of secreted melatonin in Comparative Example 1 was 100. Table 1 shows the results thereof.

TABLE 1

| Sample No. | Amount of Secreted Melatonin |
|---|---|
| Example 1 | 118 |
| Example 2 | 115 |
| Example 3 | 111 |
| Comparative Example 1 | 100 |

As is apparent from the results shown in Table 1, the amount of melatonin secreted in the subjects was larger in the white light source in each of the above-mentioned examples than that in the conventional white light source in Comparative Example 1. Melatonin is one of hormones secreted from the pineal body in a brain, and it is generally said that the amount of secreted melatonin is smaller during the day and is larger during the night. This is considered to be because humans live under natural light in the daytime. Hence, melatonin is considered as a hormone necessary to have restful sleep. Further, melatonin is widely used as supplements for preventing oxidation in the body in the U.S. and other countries.

Accordingly, with the use of the white light sources in the above-mentioned examples under circumstances where exposure to natural light is difficult (such as a hospital ward and a long-time indoor activity), an effect equivalent to that obtained by exposure to natural light can be obtained, and an effect of suppressing a sleep disorder and a circadian rhythm disturbance can be expected.

In the above-mentioned examples, the natural light in the sunrise (Example 1), the natural light at morning (Example 2), and the natural light in the daytime (Example 3) were separately prepared. Alternatively, a white light source system is configured by combining the plurality of types of light as appropriate, whereby light equivalent to one-day natural light can be also reproduced.

Figure 20:
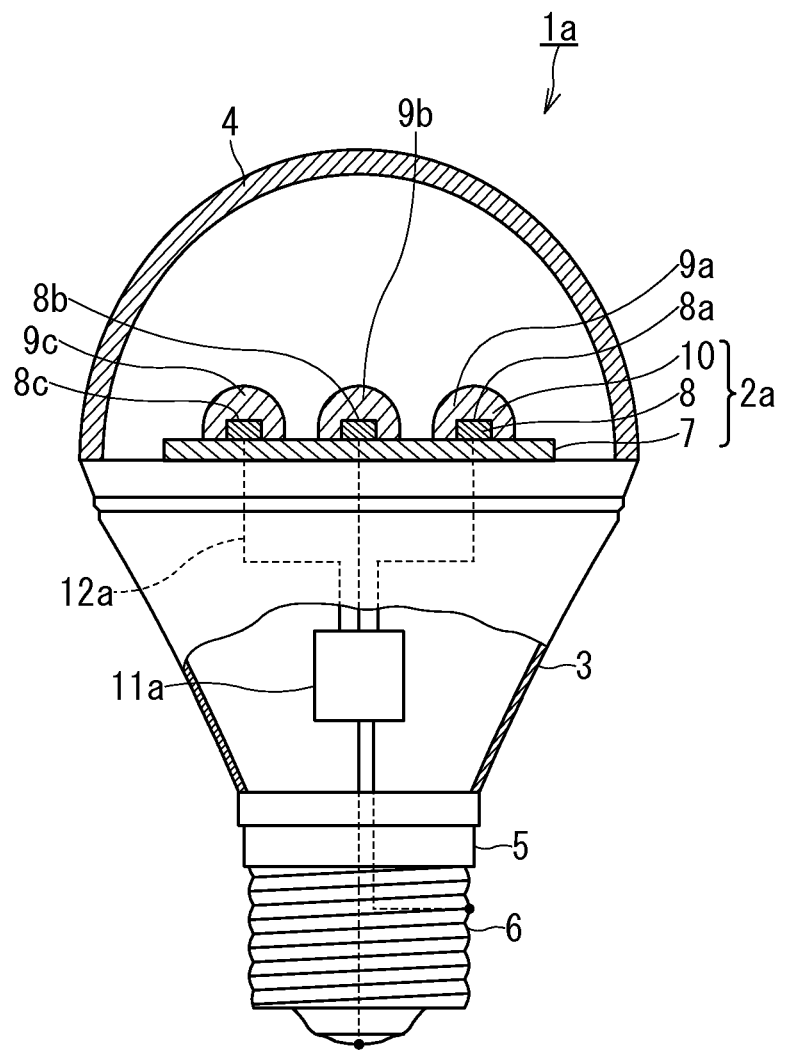
FIG. 20 is a cross sectional view illustrating another embodiment of the bulb-type white light source according to the present invention.

Specifically, as illustrated in FIG. 20, an LED chip 8a and a phosphor layer 9a for emitting the natural light in the daytime, an LED chip 8b and a phosphor layer 9b for emitting the natural light at sunrise, and an LED chip 8c and a phosphor layer 9c for emitting the natural light in the morning may be placed together on a common substrate 7. Then, the LED chips 8a, 8b, and 8c to which the phosphor layers 9a, 9b, and 9c are respectively joined may be housed in the same globe 4, whereby a white light source system 1a may be configured. Further, the transparent resin layer 10 may be provided between the LED chip 8 and the phosphor layer 9.

The LED chips 8a, 8b, and 8c are each connected to a lighting circuit 11a by a wiring line 12a. A user can select an LED chip to be turned on by means of a switching mechanism (not illustrated) attached to the lighting circuit 11a, as desired.

According to the white light source system 1a configured as described above, the natural light in the daytime, the natural light at sunrise, and the natural light in the morning can be selectively enjoyed from one white light source system 1a, in accordance with a user's desire and an illumination cycle. That is, white light sources that reproduce the natural light in the daytime, the natural light at sunrise, the natural light in the morning, the natural light in the evening, and the like are combined, whereby a white light source system that reproduces a rhythm of one-day natural light can be configured.

INDUSTRIAL APPLICABILITY

A white light source and a white light source system according to the present invention can reproduce the same light emission spectrum as that of natural light. Accordingly, even if a human body is exposed to white light emitted from the white light source for a long time, adverse effects on the human body can be made equivalent to those of natural light.

The invention claimed is:

1. A white light source comprising a blue light emitting LED having a light emission peak of 421 to 490 nm and a phosphor excited by the blue light emitting LED thereby to emit a white light, wherein the phosphor comprises four or more types of phosphors having different peak wavelengths, and at least one of the phosphor is a blue-green phosphor having a peak wavelength of 480 to 500 nm, and the white light source satisfies a relational equation of $-0.2 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.2$.

assuming that: a light emission spectrum of the white light source is $P(\lambda)$; a light emission spectrum of blackbody radiation having a same color temperature as that of the white light source is $B(\lambda)$; a spectrum of a spectral luminous efficiency is $V(\lambda)$; a wavelength at which $P(\lambda) \times V(\lambda)$ becomes largest is $\lambda max1$; and a wavelength at which $B(\lambda) \times V(\lambda)$ becomes largest is $\lambda max2$.

2. The white light source according to claim 1, wherein said white light source satisfies a relational equation of:

$-0.1 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.1$.

3. The white light source according to claim 1, wherein the color temperature of the white light source is 2,500 to 5,400 K.

4. The white light source according to claim 1, wherein said white light source comprises five or more types of phosphors having different peak wavelengths.

5. The white light source according to claim 1, wherein adjacent peak wavelengths of the phosphors are different by 150 nm or less.

6. The white light source according to claim 1, wherein said phosphor forms a phosphor layer in which phosphor particles and resin are mixed.

7. The white light source according to claim 6, wherein said phosphor layer has a multi-layered structure in which a plurality of phosphor elements formed by dispersing phosphor particles in a resin are laminated.

8. The white light source according to claim 1, comprising, wherein a plurality of the white light sources each having different light emission spectrum, wherein a plurality of blue light emitting LEDs are arranged within one housing, and wherein each of the white light sources satisfies the relational equation of $-0.2 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.2$.

9. A white light source system comprising a plurality of the white light sources according to claim 1.

10. A white light source system comprising a plurality of the white light sources according to claim 5.

* * * * *